(12) United States Patent
Bryla

(10) Patent No.: US 10,128,283 B2
(45) Date of Patent: Nov. 13, 2018

(54) METHOD AND SYSTEM FOR MANAGING HARVESTED ENERGY IN AN ACCESS CONTROL SYSTEM

(71) Applicant: Sargent Manufacturing Company, New Haven, CT (US)

(72) Inventor: Mark Bryla, Cumming, GA (US)

(73) Assignee: SARGENT MANUFACTURING COMPANY, New Haven, CT (US)

( * ) Notice: Subject to any disclaimer, the term of this patent is extended or adjusted under 35 U.S.C. 154(b) by 278 days.

(21) Appl. No.: 14/926,957

(22) Filed: Oct. 29, 2015

(65) Prior Publication Data

US 2016/0123805 A1    May 5, 2016

Related U.S. Application Data

(60) Provisional application No. 62/073,422, filed on Oct. 31, 2014, provisional application No. 62/073,446, filed on Oct. 31, 2014.

(51) Int. Cl.
| | | |
|---|---|---|
| H01L 27/142 | (2014.01) | |
| H02J 7/35 | (2006.01) | |
| H02J 9/06 | (2006.01) | |
| E05B 47/00 | (2006.01) | |

(52) U.S. Cl.
CPC .............. *H01L 27/142* (2013.01); *H02J 7/35* (2013.01); *H02J 9/06* (2013.01); *E05B 2047/0058* (2013.01); *E05B 2047/0062* (2013.01); *E05B 2047/0064* (2013.01)

(58) Field of Classification Search
CPC ... H01L 27/142; H02J 7/00; H02J 9/06; H02J 9/065; H02J 7/35; H05B 37/0218; H05B 37/02; H05B 33/08; E05B 2047/0064; E05B 2047/0062; E05B 2047/0058; G07C 9/00; G07C 9/00174; G05B 19/02; G09F 13/06

See application file for complete search history.

(56) References Cited

U.S. PATENT DOCUMENTS

| | | |
|---|---|---|
| 6,457,270 B1 | 10/2002 | Stark, III et al. |
| 7,336,150 B2 | 2/2008 | Gokcebay et al. |
| 7,999,656 B2 | 8/2011 | Fisher |
| 8,354,914 B2 | 1/2013 | Buckingham et al. |

(Continued)

*Primary Examiner* — Que T Le
*Assistant Examiner* — Jennifer Bennett
(74) *Attorney, Agent, or Firm* — DeLio, Peterson & Curcio, LLC; David R. Pegnataro

(57) ABSTRACT

A method for managing light energy received from at least one light source by at least one light sensor in an access control system. The method comprises receiving light energy by the at least one light sensor, measuring the amount of light energy received by an energy harvesting manager interconnected with an access control device, and determining whether the measured amount of light energy is above a predetermined threshold. If the measured amount of light energy is above the predetermined threshold, the method comprises converting the light energy into harvested energy by at least one energy harvester. If the measured amount of light energy is not above the predetermined threshold, the method comprises adjusting the amount of light energy available to the at least one light sensor from the at least one light source until the predetermined threshold is reached.

16 Claims, 5 Drawing Sheets

(56) References Cited

U.S. PATENT DOCUMENTS

| | | |
|---|---|---|
| 8,810,361 B2 | 8/2014 | Thukral et al. |
| 9,638,831 B1 * | 5/2017 | Hoff ........................ G01W 1/10 |
| 2005/0132766 A1 | 6/2005 | Milo |
| 2007/0090921 A1 | 4/2007 | Fisher |
| 2009/0190367 A1 * | 7/2009 | Chu ..................... B60Q 1/2615 362/487 |
| 2010/0085160 A1 | 4/2010 | Fu |
| 2011/0252845 A1 | 10/2011 | Webb et al. |
| 2011/0304296 A1 * | 12/2011 | Buelow, II .......... H01M 10/465 320/101 |
| 2012/0169453 A1 | 7/2012 | Bryla et al. |
| 2012/0304715 A1 | 12/2012 | Gore et al. |
| 2013/0000366 A1 | 1/2013 | Martel et al. |
| 2014/0021866 A1 | 1/2014 | Birru |
| 2014/0117852 A1 | 5/2014 | Zhai et al. |
| 2014/0183947 A1 | 7/2014 | Chandler et al. |
| 2014/0260459 A1 | 9/2014 | Nguyen et al. |
| 2016/0233827 A1 * | 8/2016 | Okandan ................ B64G 1/443 |

* cited by examiner

METHOD AND SYSTEM FOR MANAGING HARVESTED ENERGY IN AN ACCESS CONTROL SYSTEM

RELATED APPLICATIONS

This application claims priority to U.S. Provisional Patent App. No. 62/073,422 filed on Oct. 31, 2014, and U.S. Provisional Patent App. No. 62/073,446 filed on Oct. 31, 2014, the entire disclosures of which are incorporated herein by reference.

BACKGROUND OF THE INVENTION

1. Field of the Invention

The present invention relates to access control systems including one or more energy source sensors and energy harvesters, and more specifically, to methods and systems for management and utilization of harvested energy to power access control devices and other system implementation.

2. Description of Related Art

Access control devices or electronic locks need to be powered from an energy source, typically a primary power source such as a chemical battery. As modern electronic devices significantly reduce power consumption, it is becoming plausible to rely on other sources of energy to power such devices, either as a primary power source or as a backup or supplement to another source of energy. One such source is energy harvested from various environmental sources, and these sources of energy can be applied to an access control device using any one or a combination of their effects and can be utilized to provide power for the access control device, or can be used in other system implementation. Sources of energy other than environmental sources, such as electromotive or weak nuclear forces, despite utility for this purpose, are not generally adapted for use in access control systems. Therefore, a need exists for a means to manage and utilize various sources of harvested energy to power such devices and other system implementation.

SUMMARY OF THE INVENTION

Bearing in mind the problems and deficiencies of the prior art, it is therefore an object of the present invention to provide a system which optimizes available energy sources for use in access control systems.

It is another object of the present invention to provide a method for managing harvested energy in an access control system by monitoring available energy sources using one or more sensors to determine the amount of available energy.

A further object of the invention is to provide an improved method of managing power supply circuits in an access control system using harvested energy.

It is yet another object of the present invention to provide an improved system for harvesting energy from available energy sources for use in access control systems.

Still other objects and advantages of the invention will in part be obvious and will in part be apparent from the specification.

The above and other objects, which will be apparent to those skilled in the art, are achieved in the present invention which is directed to a system for managing light energy in an access control system, comprising an access control device positioned in an area of a building that will provide at least one light source, and at least one light sensor positioned on a surface of the access control device and receiving light energy from the at least one light source. An energy harvesting manager is coupled to the at least one light sensor, wherein the energy harvesting manager manages the amount of light energy received by the at least one light sensor. The system further comprises an interconnect between the energy harvesting manager and the access control device, and the interconnect may comprise electrical, inductive, or optical connectivity.

The energy harvesting manager may measure the amount of light energy received from the at least one light source and determine whether the measured amount of light energy is above a predetermined threshold. The system may further include at least one energy harvester, and if the measured amount of light energy is above the predetermined threshold, the energy harvesting manager may instruct the at least one energy harvester to convert the light energy into harvested energy. If the measured amount of light energy is not above the predetermined threshold, the energy harvesting manager may transmit a signal to another component in the access control system to adjust the amount of light energy available to the at least one light sensor from the at least one light source until the predetermined threshold is reached. The at least one energy harvester may be a photovoltaic cell fitted to the access control device for absorbing light energy received from the at least one light source and converting the light energy into harvested energy.

The energy harvesting manager may determine that a power level of the harvested energy is above a predetermined threshold, and the energy harvesting manager may power the access control device using the harvested energy.

The system may further comprise a secondary energy storage, and the energy harvesting manager may determine that a power level of the harvested energy is above a predetermined threshold and charge the secondary energy storage using the harvested energy. The secondary energy storage may comprise at least one of a rechargeable battery and a capacitor.

The energy harvesting manager may transmit the amount of light energy received by the at least one light sensor to another of a plurality of components in the access control system for use in management of one or more power supply circuits.

In another aspect, the present invention is directed to a method for managing light energy received from at least one light source by at least one light sensor in an access control system. The method comprises receiving light energy by the at least one light sensor, measuring the amount of light energy received by an energy harvesting manager interconnected with an access control device, and determining whether the measured amount of light energy is above a predetermined threshold. If the measured amount of light energy is above the predetermined threshold, the method comprises the light energy into harvested energy by at least one energy harvester. If the measured amount of light energy is not above the predetermined threshold, the method comprises adjusting the amount of light energy available to the at least one light sensor from the at least one light source until the predetermined threshold is reached. The amount of light energy available to the at least one light sensor may be adjusted by opening or closing a window blind or shade to vary the amount of light entering an area in which the at least one light sensor is located. The at least one energy harvester may be a photovoltaic cell or cells fitted to the access control device for absorbing light energy received from the at least one light source.

The method may further comprise determining that a power level of the harvested energy is above a predetermined threshold, and powering the access control device using the harvested energy. The method may further comprise monitoring a power level of a primary power source interconnected to the access control device, determining that the power level of the primary power source has fallen below a critical threshold, and combining the harvested energy with energy drawn from the primary power source to power the access control device.

The method may further comprise determining that a power level of the harvested energy is above a predetermined threshold, and charging an energy storage interconnected to the access control device using the harvested energy, wherein the energy storage is separate from a primary power source used to power the access control device. In another embodiment, the method may comprise monitoring a power level of a secondary power storage, determining whether the power level of the secondary power storage is above a predetermined threshold, and if the power level of the secondary power storage is not above the predetermined threshold, sending a signal by the energy harvesting manager to another component in an access control system to adjust the amount of light energy available to the at least one light sensor from the at least one light source until the predetermined threshold is reached, before converting the light energy into harvested energy by the at least one energy harvester and charging the secondary power storage using the harvested energy.

The method may further comprise, subsequent to measuring the amount of light energy received by an energy harvesting manager interconnected to the access control device, transmitting by the energy harvesting manager the measured amount of light energy received to another of a plurality of components in the access control system for use in management of one or more building power supply circuits.

In yet another aspect, the present invention is directed to a method for managing energy potential received from at least one energy source by at least one sensor interconnected with an access control device. The method comprises receiving energy potential by the at least one sensor, measuring the amount of energy potential received by an energy harvesting manager interconnected with the at least one sensor and the access control device, and determining whether the measured amount of energy potential is above a predetermined threshold. If the measured amount of energy potential is above the predetermined threshold, the method comprises converting the energy potential into harvested energy by at least one energy harvester. If the measured amount of energy potential is not above the predetermined threshold, the method comprises adjusting the amount of energy potential available to the at least one sensor from the one or more energy sources until the predetermined threshold is reached.

The at least one energy source may comprise electromagnetic induction, electrolytic-metallic contact, metallic contact, semiconductor contact, triboelectric contact or weak nuclear force, and the method may further comprise the steps of determining that a power level of the harvested energy is above a predetermined threshold, and powering the access control device using the harvested energy.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE EMBODIMENT(S)

Figure 1:
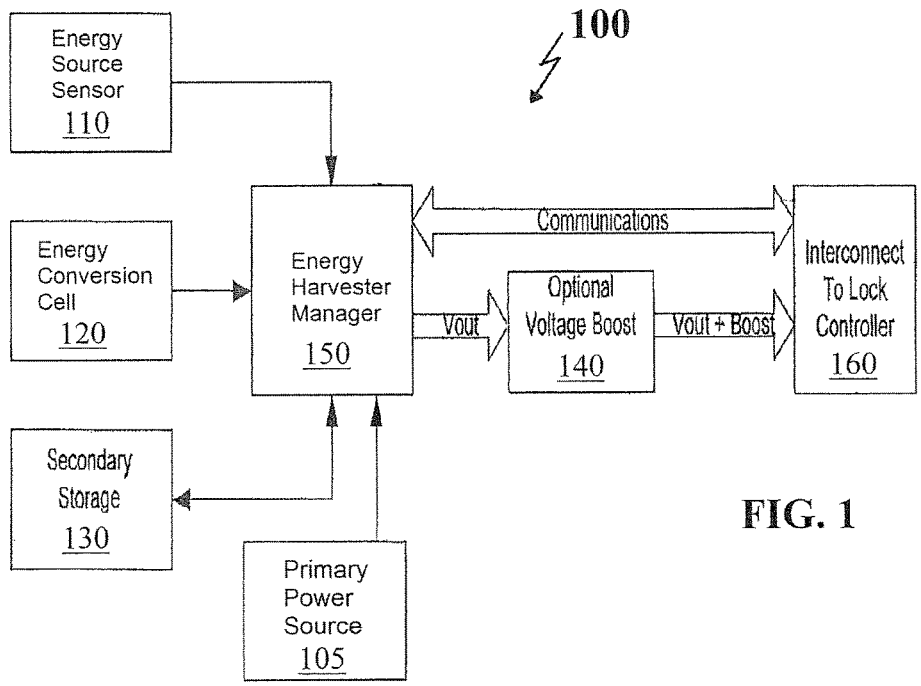
FIG. 1 is a block diagram showing an exemplary system for managing and utilizing harvested energy in an access control system, according to various embodiments of the present invention.

In describing the embodiments of the present invention, reference will be made herein to FIGS. 1-6 of the drawings in which like numerals refer to like features of the invention.

Certain terminology is used herein for convenience only and is not to be taken as a limitation of the invention. For example, words such as "upper," "lower," "left," "right," "horizontal," "vertical," "upward," and "downward" merely describe the configuration shown in the drawings. For purposes of clarity, the same reference numbers may be used in the drawings to identify similar elements.

Additionally, in the subject description, the word "exemplary" is used to mean serving as an example, instance or illustration. Any aspect or design described herein as "exemplary" is not necessarily intended to be construed as preferred or advantageous over other aspects or design. Rather, the use of the word "exemplary" is merely intended to present concepts in a concrete fashion.

The present invention is directed to systems and methods for managing and utilizing harvested energy to power access control devices and/or for other access control system implementation. Access control devices need to be powered from an energy source, typically a primary power source such as a chemical battery. As modern electronic devices significantly reduce power consumption, it is becoming plausible to rely on other sources to power such devices, either as a primary power source or as a backup or supplement to another source of energy. The types of energy available and usable for this purpose include energy harvested from the environment, such as light energy, as well as non-environmental sources such as electromotive forces or potentially weak nuclear forces. These sources of energy can be applied to an access control device using any one or a combination of their effects and can be utilized to provide power for the access control device, or can be used in other system implementation.

Aspects of the present teachings relate to an access control system including one or more energy source sensors and energy harvesting elements that can harvest energy from various identified sources to power an access control device or electronic lock, or for other system implementation. The energy harvesting elements are interconnected to a controller or energy harvesting manager which manages all energy harvesting peripherals and may use the harvested energy for system implementation including, for example, to supply or supplement the energy necessary to power an access control device. Environmental sources can include ambient or background sources of energy, examples of which include electromagnetic radiation (e.g., visible light, infrared light, radio waves, etc.), magnetic field, radiation, vibration, mechanical and biomechanical movement, heat, chemical reaction, pressure, airflow, and the like.

Referring now to FIG. 1, a block diagram of an exemplary access control system of the present invention is shown. The system 100 may generally comprise an energy harvester or energy conversion cell or device 120, an energy harvesting manager 150, and an interconnection 160 to a controller for a lock or access control device (not shown), such as a door opener or closer. Energy harvesting manager 150 manages all energy harvesting peripherals and is capable of outputting constant energy to the lock controller. Energy harvesting manager 150 can receive and manage energy absorbed or harvested by energy conversion cell 120 from one or more identified energy sources, as described in further detail below, and can use the harvested energy to power and/or control the access control device, or for other system implementation. Energy harvesting manager 150 can manage energy harvested by energy conversion cell 120 by, for example, monitoring the availability of harvested energy, conditioning the harvested energy, combining the harvested energy with energy from another source, communicating with the lock controller, and the like. Energy harvesting manager 150 can condition the harvested energy, for example, by rectifying, smoothing, stepping up, and/or stepping down the voltage of the harvested energy. In one or more embodiments, the system 100 may include a voltage boost 140 that is optimized for interfacing with the connected lock controller or access control device.

Energy harvesting manager 150 may include a voltage converter, a regulating circuit, rectifiers and matching networks, a power conditioner, a power switch/combiner, and/or any other hardware or software configured to provide power continuously, periodically, or on-demand. Energy harvesting manager 150 may be interconnected to a secondary energy storage 130 and can store the harvested energy in energy storage 130, or can draw energy from energy storage 130 to supplement or provide the energy needed to power the access control device. Energy harvesting manager 150 can control the continuous, periodic, or sporadic charging or discharging of energy storage 130. Secondary energy storage 130 may be a rechargeable battery, a capacitor, a combination of a battery and a capacitor, or may be any other rechargeable energy storage known to one skilled in the art. Energy harvesting manager 150 can divert and regulate the voltage and/or amperage of the harvested energy to charge energy storage 130, and can draw power from energy storage 130 as needed to power the access control device.

Energy harvesting manager 150 can also manage harvested energy by switching between the harvested energy and energy from another source to power the access control device, such as a primary power source 105, e.g. a chemical battery or mains power, based on the availability of the harvested energy and power demands of the access control device. For example, energy harvesting manager 150 can switch to harvested energy and rely on the harvested energy to power the access control device when energy harvesting manager 150 determines that a power level of the harvested energy, which may be stored in secondary energy storage 130, is above a threshold. Energy harvesting manager 150 can determine the power level based on the harvested energy's potential (e.g., voltage), flow rate (e.g., amperage), and/or power (e.g., wattage). For another example, energy harvesting manager 150 can switch to a non-harvested source of power, such as chemical batteries or mains power 105, to power the access control device when energy harvesting manager 150 determines that the power level of harvested energy falls below a threshold.

According to various embodiments, the system of the present invention is capable of absorbing energy from a variety of identified energy sources, including environmental sources, such as visible light, electromotive sources or weak nuclear forces, and converting the absorbed energy into another form of energy, for example, electromagnetic radiation to electricity, mechanical (e.g., vibration, pressure, motion, etc.) to electricity, heat to electricity, magnetic field to electricity, chemical reaction to electricity, and the like. Examples of electromotive forces available and usable to power the access control device include electromagnetic induction, electrolytic-metallic contact, metallic contact, semiconductor contact, or triboelectric contact, as described in more detail below. Alternatively, a weak nuclear force, e.g. radioactive decay, can result in spontaneous heat creation which can create power which can be converted into a useable potential to produce a charge to directly source a power supply or charge a secondary power storage in an access control system.

In one or more embodiments of the access control system of the present invention, electromagnetic induction may be utilized to either transfer power to the access control device directly through a conductor or through coupling. An electrical generator, such as a dynamo, may be used to produce a direct current flow that connects directly to the access control device. The mechanical force used to drive the dynamo may be linear or angular momentum, and the power may be converted into a useable potential by energy conversion cell 120 and utilized by energy harvesting manager 150 to produce a charge in secondary power storage supply 130 or to directly source a power supply, e.g. to power the lock or access control device directly. Energy harvesting manager 150 may further communicate with the lock controller or access control device and the interconnection 160 between the energy harvesting manager and the lock controller may be electrical, inductive, optical, or any other method known to one skilled in the art. The access control system may further include an energy source sensor 110 interconnected with energy harvesting manager 150 for higher level management of the energy source and its utility.

In another embodiment, inductive coupling transformers may be used to induce direct transfer of energy between two or more circuits through electromagnetic induction. A varying current in the transformer's primary winding creates a varying magnetic flux in the core and a varying magnetic field impinging on the secondary winding. The varying magnetic field at the secondary winding induces a varying electromotive force (emf) in the secondary winding, and the power may be converted into a useable potential by energy conversion cell 120 and utilized by energy harvesting manager 150 to similarly produce a charge in secondary power storage supply 130 or to directly source a power supply for the lock or access control device.

In still another embodiment, the system may be capable of sensing a wireless energy transfer, such as through near-field or far-field RF. Near-field RF may be a reactive near field and/or radiative near field. In reactive near field, either E or H fields dominate; whereas in radiative near-field, there are no reactive field components. The near-field radiative or reactive power can be transmitted or absorbed up to a range of two times the wavelength. The transmitted power may be converted into a useable potential by energy conversion cell 120 and utilized by energy harvesting manager 150 to produce a charge in secondary power storage supply 130 or to directly source a power supply. In far-field RF, radiation decreases as the square of distance and absorption of the radiation does not feed back to the transmitter. The far field RF is dominated by E and B fields. Energy can be transmitted over distances that are two times the wavelengths. The radiated power may be converted into a useable potential by energy conversion cell 120 and utilized by energy harvesting manager 150 to similarly produce a charge in secondary power storage supply 130 or to directly source a power supply for the lock or access control device.

In other embodiments of the present invention, a device for inducing electrolytic-metallic or metallic contact may be coupled to the access control system to provide a power source. Electrolytic-metallic contact from chemical sources, such as batteries or fuel cells, may be used to power the access control device as a time-released power source or power storage device. Batteries, through redox reactions, may be used as a primary power source, and may be in cell form and common types such as Alkaline, Lithium Ion, and Nickel Metal Hydride. Alternatively, fuel cells may be a primary power source that over timed releases may be used to produce a charge in secondary power storage supply 130 or to directly source a power supply. In one or more embodiments, a device inducing metallic contact coupled to the access control system may be utilized to release or transduce a potential from a metallic to metallic contact, such as in thermoelectric/pyroelectric contact resulting in the Seebeck effect, e.g. conversion of temperature differences directly into electricity. In an embodiment of the present invention, a thermoelectric device creates voltage when there is a temperature gradient between metallic to metallic contacts, and this conversion of heat to electricity can be used as a power source. The power may be converted into a useable potential by energy conversion cell 120 and utilized by energy harvesting manager 150 to produce a charge in secondary power storage 130 or to directly source a power supply for the lock or access control device.

In still other embodiments of the present invention, a device for inducing triboelectic contact may be coupled to the access control system to provide a power source. Generally, if two different insulators are placed together or rubbed together, one of the two insulators will acquire a negative charge and the other will acquire an equal positive charge. When the two insulators are pulled apart, a potential is produced. This potential can be used to generate power, which may be converted into a useable potential by energy conversion cell 120 and utilized by energy harvesting manager 150 to similarly produce a charge in secondary power storage 130 or to directly source a power supply for the lock or access control device.

In still yet other embodiments of the present invention, the system may utilize semiconductor contact, e.g. a metallic contact with a semiconductor material, or two different semiconductors that are placed in contact, to provide a power source. Generally, when a metal contacts a semiconductor material or when two semiconductors are placed in contact, one material becomes slightly positively-charged and the other slightly negatively-charged. In materials, for example, with a direct band gap, if a bright light is aimed at one part of the contact area between the two semiconductors, the voltage at that spot rises and electric current will appear. One such example is the piezoelectric effect, e.g. mechanical stress or pressure, wherein an electrical charge accumulates in certain solid materials in response to applied mechanical stress. The power can be converted into a useable potential by energy conversion cell 120 and utilized by energy harvesting manager 150 to produce a charge in secondary power storage 130 or to directly source a power supply for the lock or access control device.

Another such example of semiconductor contact is the photovoltaic effect. In various embodiments of the present invention, the access control system may utilize solar cells or photovoltaic cells to convert and/or harvest light energy into useable potential. Solar cells are, in general, a semiconductor to semiconductor contact with a direct band gap between the materials that is optimized to cause flow between the materials when solar or sun light spectrums are aimed at the point of contact. At this point of contact, light energy is converted into electrical energy. Photovoltaic cells use the same principals as solar cells, but the spectrums are optimized from shorter spans. The light energy power can be converted into a useable potential by energy conversion cell 120 and utilized by energy harvesting manager 150 to produce a charge in secondary power storage 130 or to directly source a power supply for the lock or access control device.

The system of the present invention may include one or more harvesters capable of harvesting energy from one source or multiple harvesters capable of harvesting energy from one or more sources. For example, the system may include a photovoltaic cell, an array of photovoltaic cells, a photovoltaic cell and a piezoelectric transducer, an array of photovoltaic cells and a piezoelectric transducer, and the like. In configurations where the system includes multiple harvesters, energy harvesting manager 150 can monitor the availability of energy being harvested by each harvester, condition the energy being harvested by each harvester, switch between or combine the energy being harvested by each harvester to the power access control device, and the like. Furthermore, in configurations where the system includes multiple types of harvesters each capable of harvesting energy from a different environmental source, energy harvesting manager 150 can monitor the availability of energy being harvested by each type of harvester, condition the energy being harvested by each type of harvester, switch between or combine the energy being harvested by each type of harvester to the power access control device, and the like.

Figure 2:
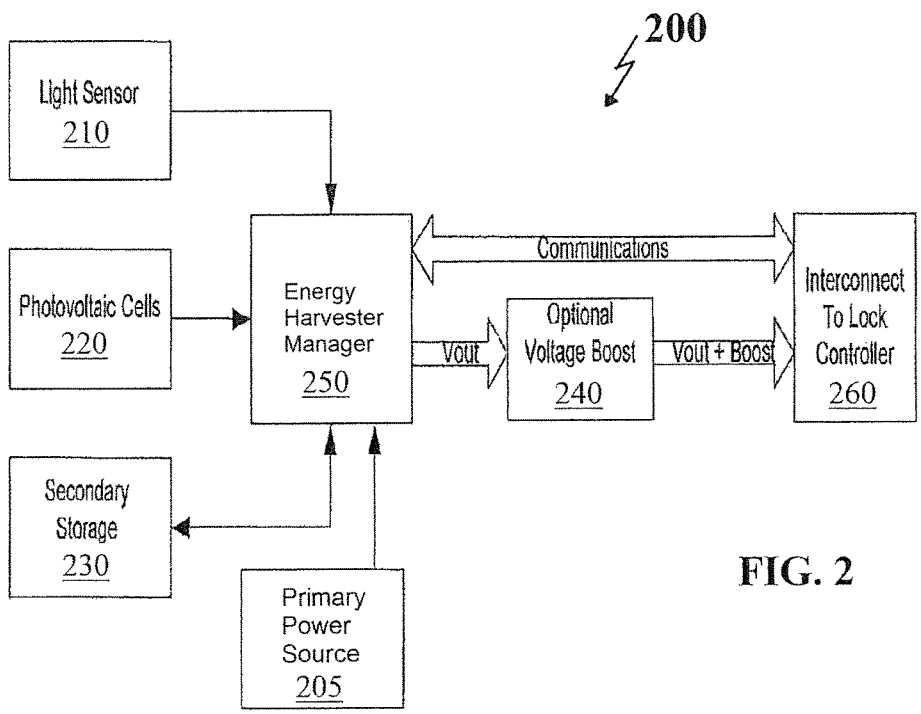
FIG. 2 is a block diagram showing a system for managing and utilizing harvested light energy in an access control system, according to an embodiment of the present invention.

FIG. 2 depicts in block diagram an exemplary access control system of the present invention which utilizes harvested photovoltaic energy. The system 200 is substantially identical to that described above for managing and utilizing energy harvested from electromotive or weak nuclear forces, and may comprise a light sensor or sensors 210, a photovoltaic cell or cells 220, a secondary storage device 230, an energy harvesting manager 250, a primary power source 205, e.g. conventional building AC or DC power or a battery, and an interconnection 260 to a controller for a lock or access control device, such as a door opener or closer (not shown). The photovoltaic cell or cells 220 may be connected to the energy harvesting manager, and are used to absorb light energy from one or more identified light energy sources, as described in further detail below.

The energy harvesting manager 250 manages all energy harvesting peripherals and is capable of outputting constant energy to the lock controller or access control device. Energy harvesting manager 250 can receive and manage energy absorbed or harvested by photovoltaic cell or cells 220 from one or more identified light energy sources, and use the harvested energy to power and/or control the access control device, or for other system implementation, as described in further detail below. Energy harvesting manager 250 can condition the harvested light energy, for example, by rectifying, smoothing, stepping up, and/or stepping down the voltage of the harvested energy. In one or more embodiments, the system 200 may include a voltage boost 240 that is optimized for interfacing with the connected lock controller or access control device.

Figures 3, 3A:
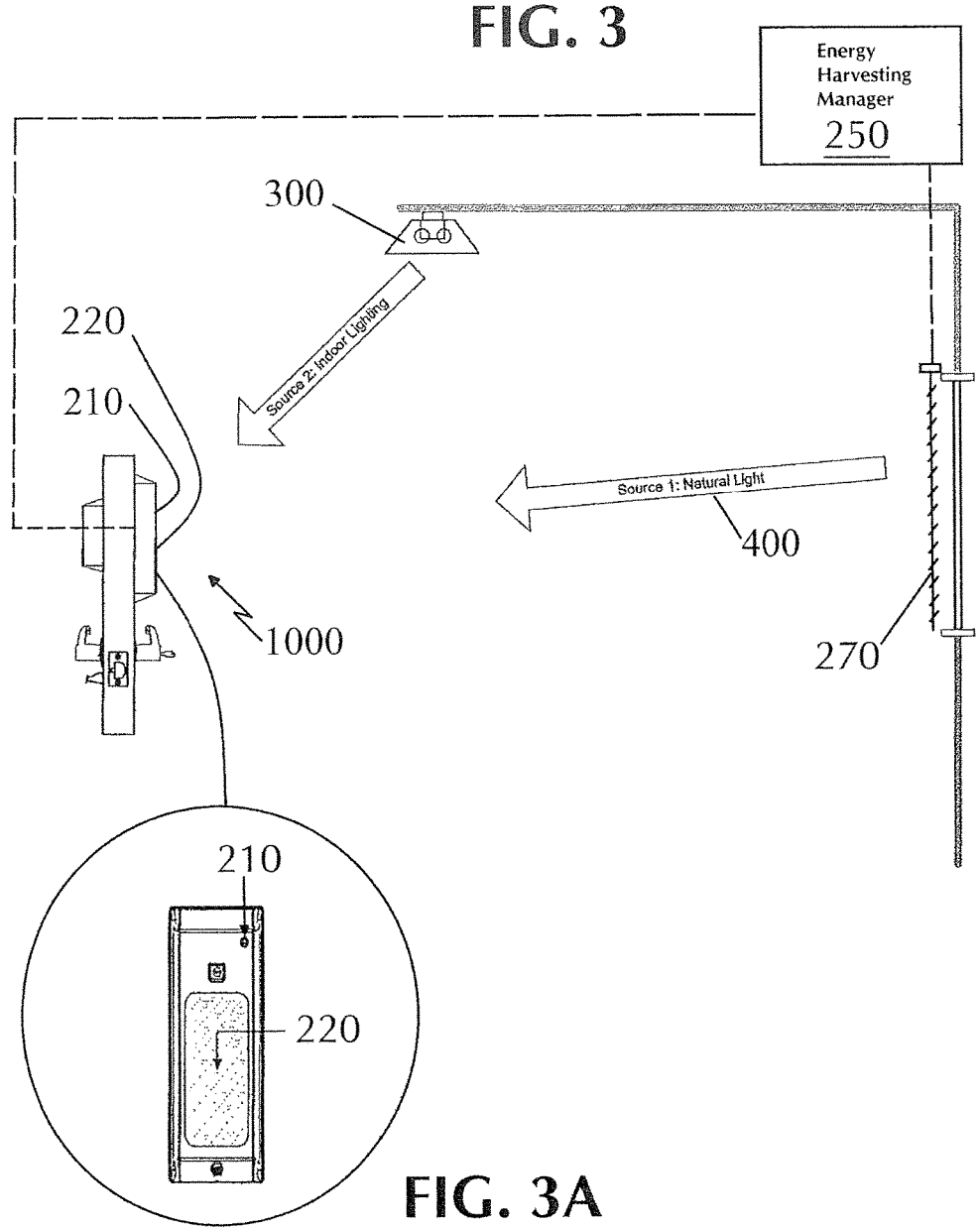
FIG. 3 is an exemplary access control device including one or more light sensors positioned in an area that will provide one or both of artificial and natural light sources.
FIG. 3A is a plan view of the access control device of FIG. 3, showing a light sensor in conjunction with a photovoltaic cell.
Figure 4A:
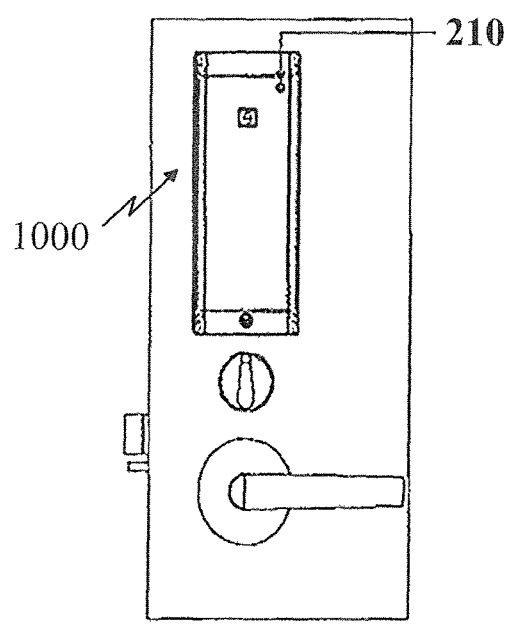
FIGS. 4A and 4B are exemplary embodiments of a door with an access control device including one or more light sensors positioned on the interior (FIG. 4A) and exterior (FIG. 4B) surfaces, respectively, of the door.
Figure 4B:
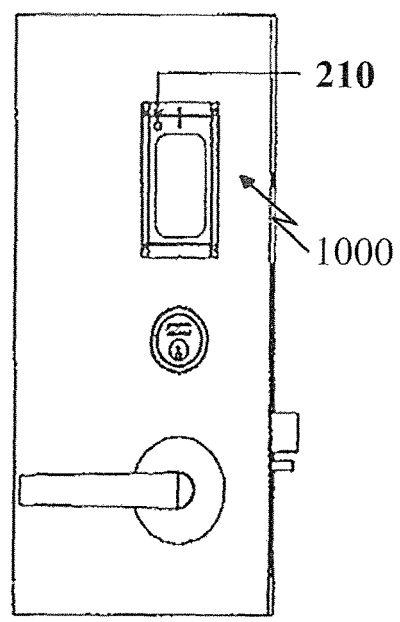

Referring now to FIG. 3, an access control device or electrically controlled lock 1000 is fitted with a light sensor 210 and placed in a room or other area of a building that will provide at least one identified light source 300, 400. As shown in FIG. 3, the light source may an artificial light source, such as overhead lighting 300, or a natural light source, such as solar or sun light 400, or both. The amount of natural light may be controlled by, for example, adjusting the position of blinds or window shade 270 which determine the amount of light 400 that reaches the light sensor 210 and optional photovoltaic cell or cells 220 (FIG. 3A). The light source's intensity, angle of incidence, spectrum and duration may be variable, and the light sources may be inside or outside of the visible spectrum. In an embodiment of the present invention, the light sensor or sensors may be fitted to either the interior-facing, i.e. inside a room (FIG. 4A) or exterior-facing, i.e. outside a room (FIG. 4B) surface of the lock 1000.

The light sensor 210 may use pyranometer, solar, irradiance curves or other irradiance curves, such that a comparable energy input as seen by a one-junction or more photovoltaic cell(s) can be determined. The light sensor 210 may be fed into an energy harvesting manager 250, as described above, where information obtained from the light sensor can either be used locally, used and stored locally, or transmitted to a different component in the access control system where it can be used and stored. The resulting information obtained from the light sensor 210 may be used for management of power supply circuits or other system implementation. For example, the light source information may be used for building management to help ensure that a light source or sources is/are appropriate for a defined area, or may be used for diagnostic purposes, such as determining trends for the lock and to determine if the lock can be used with a photovoltaic power source cost effectively, e.g. the light sensor 210 provides the ability to sense and measure how much light energy is available to use, which measured quantity may be used to determine if harvesting the light energy, such as by using a photovoltaic cell or cells 220, is possible and/or advisable. The light sensor 210 may also be retrofitted to an existing lock or access control device and used to determine how efficient energy harvesting has been on pre-existing hardware. The light sensor(s) 210 may be optimized using methods to focus light from one or more sources, and/or may be optimized to determine from which source or sources the light energy is coming from. Implementations of the present invention may be for access control devices or electrically controlled locks that do not include photovoltaic cell(s), as described above, or for locks that include a light sensor in conjunction with photovoltaic cell(s) for harvesting some or all of the light energy detected by the light sensor.

Figure 5A:
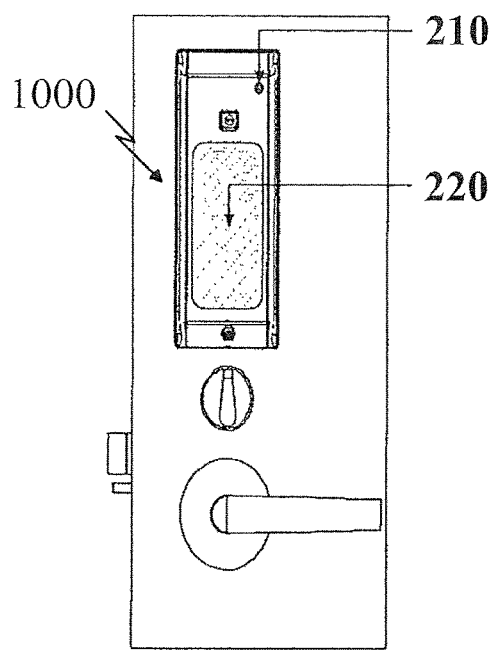
FIGS. 5A and 5B are exemplary embodiments of a door with an access control device including one or more light sensors in conjunction with photovoltaic cell(s) positioned on the interior (FIG. 5A) and exterior (FIG. 5B) surfaces, respectively, of the door.
Figure 5B:
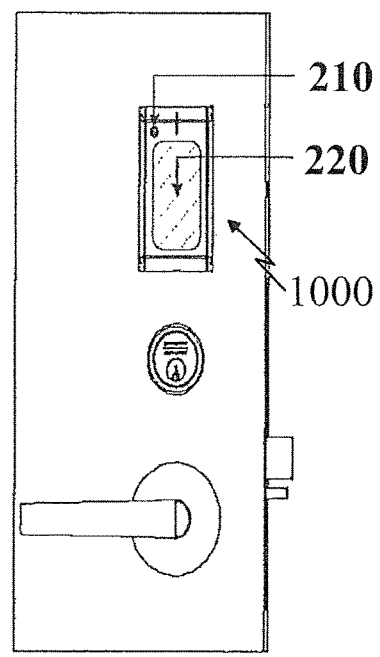

Referring now to FIGS. 5A and 5B, embodiments of the present invention including a light sensor or sensors 210 in conjunction with a photovoltaic cell or cells 220 are shown. As shown in the Figures, the photovoltaic cell or cells may be fitted to either the interior-facing, i.e. inside a room (FIG. 5A) or exterior-facing, i.e. outside a room (FIG. 5B) surface of the lock 1000, and may be on a permanent surface of the lock, as shown, or on a removable part of the lock. The photovoltaic cell or cells may be thin film or otherwise, and may be constructed of either single or multi-junction cells that give the ability to be optimized for either artificial light sources or natural light sources or both, or used to increase efficiency of energy conversion. In an embodiment, the light sources that are used are generally comprised of visible light, but light outside this spectrum is not excluded. The photovoltaic cell or cells 220 may be designed to be optimized to maximize energy received from either natural or artificial light sources by setting an angle of incidence with respect to their light sources. Methods to focus light from one or more sources may be used to optimize utility of available light sources. For implementations of a lock with a light sensor and a photovoltaic cell or cells, as shown in FIGS. 5A and 5B, the light sensor 210 may be used to manage and optimize the efficiency of the energy harvesting from the light sources. In certain embodiments, the implementation of a light sensor with a photovoltaic cell and the power supply may be used in a larger system that may potentially control sources of light, such as issuing a system warning to ensure that window blinds or shades are left open or opened to a certain degree for a specified period of time to help recharge a secondary energy storage, as described above. Such blinds or shades 270 are shown in FIG. 3 and may be controlled by energy harvesting manager 250 to open or close the blinds or shades to a desired degree to control the amount of natural light 400 that reaches photovoltaic cell(s) 220.

Figure 6:
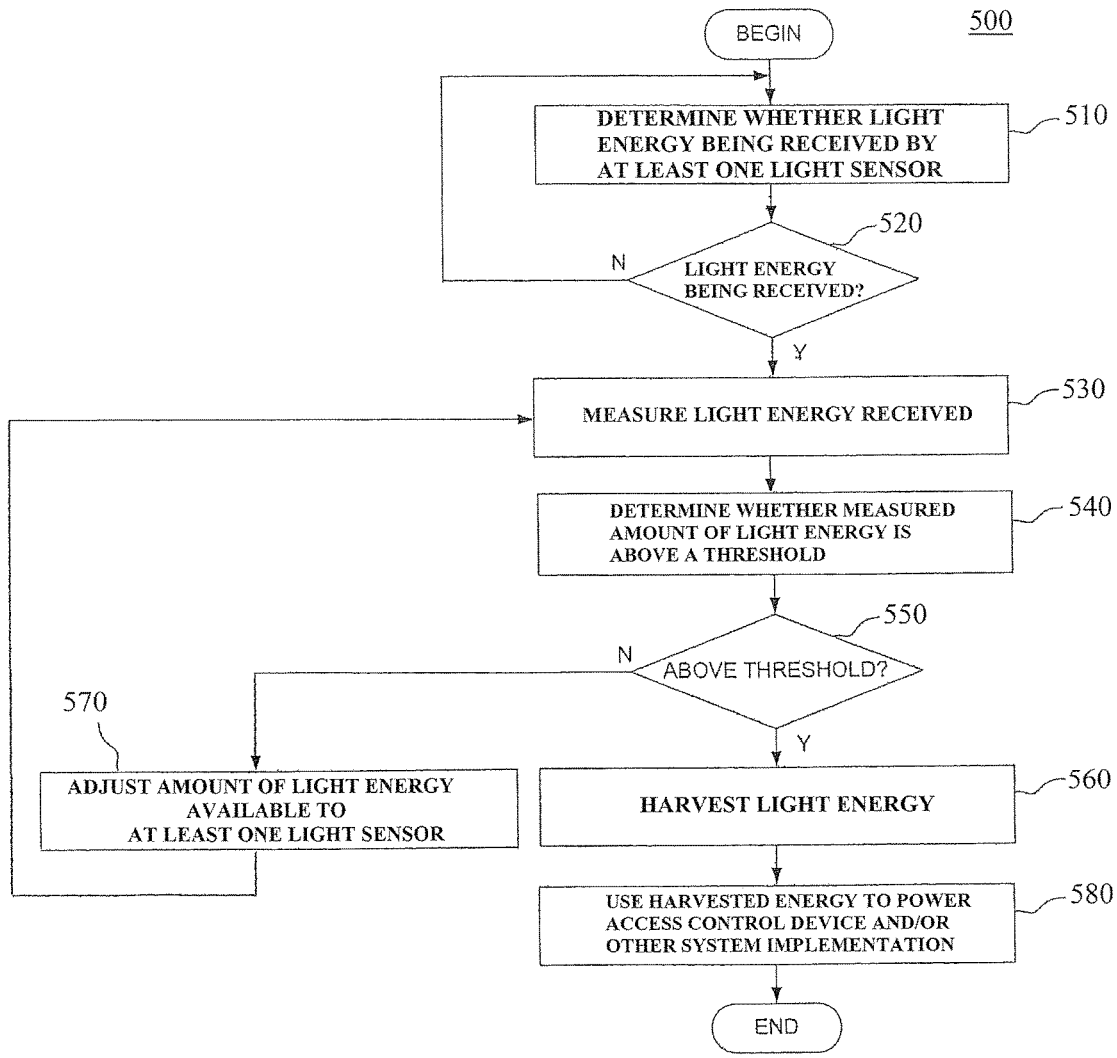
FIG. 6 is a process flow diagram showing the steps performed by the system of the present invention to manage and utilize light energy received from one or more light sources, according to various embodiments of the present teachings.

FIG. 6 illustrates an exemplary methodology and/or flow diagram of processing 500 performed by the system of the present invention to manage and utilize light energy harvested from identified energy sources in accordance with embodiments of the present invention. In various embodiments, one or more components of the system, such as energy harvesting manager 250, can perform processing 500, or other similar processes to manage energy harvested from one or more identified energy sources to power an access control device or for other system implementation. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented and described herein. Furthermore, not all illustrated acts may be required to implement the methodologies in accordance with the claimed subject matter. In addition, those skilled in the art should understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

In various embodiments, system 200 can perform processing 500, as shown in FIG. 6, to manage and utilize light energy provided by one or more identified light sources. In 510, energy harvesting manager 250 can determine whether or not light energy is being received by at least one light sensor 210. In configurations where the system includes more than one light sensor, energy harvesting manager 250 can monitor the availability of light energy being received by each, some, or all of the light sensors 210. Next, in 520, if energy harvesting manager 250 has determined that no light sensor is receiving light energy, then processing 500 can either return to 510 or terminate. Alternatively, if energy harvesting manager 250 has determined that light energy is being received by at least one light sensor, then processing 500 can proceed to 530. In 530, energy harvesting manager 250 measures the amount of light energy received by the one or more light sensors 210 and may either use the information locally, store the information locally for later use, or transmit the information to another component in the system where it can be used and/or stored.

In 540 and 550, energy harvesting manager 250 can determine whether or not a potential or power level (e.g., voltage, amperage, and/or wattage) of the light energy received is above a threshold, and determine whether there is sufficient light energy available to harvest the energy. Energy harvesting manager 250 can use this measured quantity to optimize the efficiency of the energy harvesting from its light sources 210. In 570, if energy harvesting manager 250 has determined that the measured amount of light energy received is not above a threshold, light sensors 210 may be optimized by transmitting a signal from energy harvesting manager 250 to another component in the access control system to focus light from one or more light sources by adjusting the amount of light energy available to at least one light sensor, for example, by adjusting the position of window blinds or shades 270 in a room (FIG. 3). Processing 500 may then return to 530 and repeat steps 530 through 550 until the potential of the light energy received is above a threshold, or processing 500 may terminate.

In 560, energy harvesting manager 250 can harvest some or all of the available light energy using one or more energy harvesters, such as one or more photovoltaic cells 220, and manage the harvested energy. In configurations where the system includes multiple harvesters, energy harvesting manager 250 can monitor the power level of energy being harvested by each, some, or all of the harvesters. Energy harvesting manager 250 can manage the harvested energy by conditioning the harvested energy, such as by rectifying, smoothing, stepping up, and/or stepping down the voltage of the harvested energy. Energy harvesting manager 250 can also manage the harvested energy by combining the harvested energy with energy from one or more other sources, such as a primary power source, e.g. a battery, for powering an access control device. In configurations where the system includes multiple harvesters, energy harvesting manager 250 can combine the energy harvested by some or all of the harvesters. Energy harvesting manager 250 can further manage harvested energy by switching between the harvested energy and energy from another source, such as a primary power source, to power an access control device based on the availability of the harvested energy and power demands of the access control device. In one or more embodiments, energy harvesting manager 250 can further manage harvested energy by using harvested energy to charge a secondary energy storage, such as a rechargeable battery or capacitor, which can then be used to power an access control device directly or to supplement a primary power supply. Finally, in 580, energy harvesting manager 250 can use the harvested energy to power an access control device and/or for other system implementation, and then processing 500 can terminate.

The foregoing description is illustrative, and variations in configuration and implementation may occur to persons skilled in the art. For instance, the various illustrative logics, logical blocks, modules, and circuits described in connection with the embodiments disclosed herein can be implemented or performed with a general purpose processor, a digital signal processor ("DSP"), an application specific integrated circuit, a field programmable gate array or other programmable logic device, discrete gate or transistor logic, discrete hardware components, or any combination thereof designed to perform the functions described herein. A general-purpose processor can be a microprocessor, but, in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described herein to be performed by the energy harvesting manager and other devices used in the invention can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various means as is known in the art.

If implemented in software, the functions may be stored on or transmitted over a computer-readable medium as one or more instructions or code. Computer-readable media includes both tangible computer storage media and communication media including any medium that facilitates transfer of a computer program from one place to another. A storage media may be any available tangible media that can be accessed by a computer. By way of example, and not limitation, such tangible computer-readable media can comprise RAM, ROM, flash memory, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, DVD, floppy disk and blu-ray disc where disks usually reproduce data magnetically, while discs reproduce data optically with lasers. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Combinations of the above should also be included within the scope of computer-readable media. Resources described as singular or integrated can in one embodiment be plural or distributed, and resources described as multiple or distributed can in embodiments be combined.

Thus, the present invention achieves one or more of the following advantages. The present invention provides a system which optimizes available energy sources for use in access control systems by monitoring available environmental and non-environmental energy sources using one or more energy source sensors to determine if energy harvesting is possible and/or advisable. The system of the present invention further increases the efficiency of energy harvesting by optimizing available energy sources. The present invention further provides an improved method for managing available energy sources in an access control system and for managing power supply circuits in an access control system using harvested energy.

While the present invention has been particularly described, in conjunction with specific embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A system for managing light energy in an access control system, comprising:
    an access control device positioned in an area of a building that will provide at least one light source;
    at least one light sensor positioned on a surface of the access control device and receiving light energy from the at least one light source, the at least one light sensor using irradiance curves to determine energy potential received from the at least one light source;
    an energy harvesting manager coupled to the at least one light sensor, wherein the energy harvesting manager manages the amount of energy potential received by the at least one light sensor, the energy harvesting manager adapted to measure the amount of energy potential received; determine whether the measured energy potential is above a predetermined threshold for harvesting; responsive to a determination that the measured energy potential is above the predetermined threshold, direct an energy conversion cell to convert light energy received from the at least one light source into a useable potential for system implementation by the energy harvesting manager; and measuring efficiency of energy harvesting for diagnostics and further system implementation;
    at least one energy conversion cell adapted to convert light energy received from the at least one light source into a useable potential for system implementation by the energy harvesting manager; and
    an interconnect between the energy harvesting manager and the access control device.

2. The system of claim 1 wherein the interconnect between the energy harvesting manager and the access control device comprises electrical, inductive, or optical connectivity.

3. The system of claim 1
    wherein if the measured amount of energy potential is above the predetermined threshold, the energy harvesting manager is adapted to instruct the at least one energy conversion cell to convert the light energy into harvested energy, and
    wherein if the measured amount of energy potential is not above the predetermined threshold, the energy harvesting manager is adapted to transmit a signal to another component in the access control system to adjust the amount of light energy available to the at least one light sensor from the at least one light source until the predetermined threshold is reached.

4. The system of claim 3 wherein the at least one energy conversion cell is a photovoltaic cell or cells fitted to the access control device.

5. The system of claim 3 wherein responsive to the energy harvesting manager determining that a power level of the harvested energy is above a predetermined threshold, the energy harvesting manager is adapted to powers the access control device using the harvested energy.

6. The system of claim 3 further comprising a secondary energy storage, and wherein the energy harvesting manager is adapted to determine whether a power level of the harvested energy is above a predetermined threshold and, responsive to determining that the power level is above the predetermined threshold, charge the secondary energy storage using the harvested energy.

7. The system of claim 6 wherein the secondary energy storage comprises at least one of a rechargeable battery and a capacitor.

8. The system of claim 1 wherein the energy harvesting manager is adapted to transmit at least a portion of the amount of useable energy potential created by the at least one energy conversion cell to another of a plurality of components in the access control system for use in management of one or more power supply circuits.

9. A method for managing light energy received from at least one light source by at least one light sensor in an access control system, comprising:
    providing an access control device including at least one light sensor positioned on a surface thereof for receiving light energy from at least one light source;
    receiving light energy by the at least one light sensor, the at least one light sensor using irradiance curves to determine energy potential received;
    measuring the amount of energy potential received by an energy harvesting manager interconnected with the access control device;
    determining, by the energy harvesting manager, whether the measured amount of energy potential is above a predetermined threshold for harvesting;
    responsive to a determination that the measured amount of energy potential is above the predetermined threshold for harvesting, converting, by at least one energy conversion cell, light energy received by the at least one light sensor into useable potential for system implementation by the energy harvesting manager; and
    measuring, by the energy harvesting manager, efficiency of energy harvesting for diagnostics and further system implementation.

10. The method of claim 9 wherein the at least one energy conversion cell is a photovoltaic cell or cells fitted to the access control device.

11. The method of claim 9 further comprising:
    determining that a power level of the harvested energy is above a predetermined threshold; and
    powering the access control device using the harvested energy.

12. The method of claim 9 further comprising:
monitoring a power level of a primary power source interconnected to the access control device;
determining that the power level of the primary power source has fallen below a critical threshold; and
combining the harvested energy with energy drawn from the primary power source to power the access control device.

13. The method of claim 9 further comprising:
determining that a power level of the harvested energy is above a predetermined threshold; and
charging an energy storage interconnected to the access control device using the harvested energy, wherein the energy storage is separate from a primary power source used to power the access control device.

14. The method of claim 9 further comprising:
monitoring a power level of a secondary power storage;
determining whether the power level of the secondary power storage is above a predetermined threshold;
if the power level of the secondary power storage is not above the predetermined threshold, sending a signal by the energy harvesting manager to another of a plurality of components in an access control system to adjust the amount of light energy available to the at least one light sensor from the at least one light source until the predetermined threshold is reached;
converting the light energy into harvested energy by the at least one energy conversion cell; and
charging the secondary power storage using the harvested energy.

15. The method of claim 9 further comprising:
transmitting, by the energy harvesting manager, at least a portion of the energy potential created by the at least one energy conversion cell to another component in the access control system for use in management of one or more building power supply circuits.

16. The method of claim 9 wherein the amount of light energy available to the at least one light sensor is adjusted by opening or closing a window blind or shade to vary the amount of light entering an area in which the at least one light sensor is located.

* * * * *